United States Patent
Shivaram et al.

(10) Patent No.: US 9,030,238 B2
(45) Date of Patent: May 12, 2015

(54) SEMICONDUCTOR DEVICE AND METHOD OF CASCADING MATCHED FREQUENCY WINDOW TUNED LC TANK BUFFERS

(71) Applicant: Semtech Corporation, Camarillo, CA (US)

(72) Inventors: Krishna Shivaram, Torrance, CA (US); Craig Hornbuckle, Rolling Hills Estates, CA (US)

(73) Assignee: Semtech Corporation, Camarillo, CA (US)

( * ) Notice: Subject to any disclaimer, the term of this patent is extended or adjusted under 35 U.S.C. 154(b) by 10 days.

(21) Appl. No.: 14/010,249

(22) Filed: Aug. 26, 2013

(65) Prior Publication Data
US 2015/0054561 A1   Feb. 26, 2015

(51) Int. Cl.
| H03B 1/00 | (2006.01) |
| H03K 3/00 | (2006.01) |
| H03K 5/1252 | (2006.01) |
| H01L 21/8234 | (2006.01) |

(52) U.S. Cl.
CPC .......... *H03K 5/1252* (2013.01); *H01L 21/8234* (2013.01)

(58) Field of Classification Search
USPC .................................................. 327/108–112
See application file for complete search history.

(56) References Cited

U.S. PATENT DOCUMENTS

| 6,198,307 | B1 * | 3/2001 | Garlepp et al. ................. 326/83 |
| 7,023,272 | B2 * | 4/2006 | Hung et al. ..................... 330/126 |
| 7,439,811 | B2 * | 10/2008 | Kim et al. ....................... 330/305 |
| 7,598,811 | B2 * | 10/2009 | Cao ................................. 330/304 |
| 8,749,276 | B2 * | 6/2014 | Nakazawa ...................... 327/108 |
| 2001/0035768 | A1 * | 11/2001 | Garlepp et al. ................. 326/30 |
| 2008/0048736 | A1 * | 2/2008 | Ruy ................................ 327/108 |
| 2009/0016421 | A1 * | 1/2009 | Masaki ........................... 375/232 |
| 2010/0141340 | A1 * | 6/2010 | Huang et al. ................... 330/253 |
| 2012/0286889 | A1 * | 11/2012 | Park et al. ................ 331/117 FE |
| 2013/0099871 | A1 * | 4/2013 | Wang ............................. 331/57 |
| 2013/0307630 | A1 * | 11/2013 | Ma et al. ......................... 331/34 |
| 2014/0077890 | A1 * | 3/2014 | Babaie et al. .............. 331/117 R |
| 2014/0104010 | A1 * | 4/2014 | Chen et al. ............... 331/117 FE |
| 2014/0159825 | A1 * | 6/2014 | Samala et al. ............ 331/117 R |
| 2014/0162580 | A1 * | 6/2014 | Leung et al. ................ 455/226.1 |

OTHER PUBLICATIONS

Heydari, Payam et al., "Design of Ultra High-Speed CMOS CML Buffers and Latches", Proceedings of the 2003 IEEE International Symposium on Circuits and Systems, vol. 2, pp. II-208-II-2011, May 2003.

* cited by examiner

*Primary Examiner* — Adam Houston
(74) *Attorney, Agent, or Firm* — Robert D. Atkins; Patent Law Group: Atkins and Associates, P.C.

(57) ABSTRACT

A tunable buffer circuit has a first tunable buffer cell receiving an input signal. A first transmission line is coupled to the first tunable buffer cell. A second tunable buffer cell is coupled to the first transmission line. A center frequency and bandwidth of the second tunable buffer cell is matched to a center frequency and bandwidth of the first tunable buffer cell to achieve low phase noise with low power. Additional transmission lines and tunable buffer cells can be cascaded in the tunable buffer circuit. Each tunable buffer cell has first and second transistors including first and second conduction terminals and control terminal coupled for receiving the input signal. An inductor and tunable capacitor are coupled between the first conduction terminals of the first and second transistor. A digital signal adjusts the tunable buffer cells in response to an RSSI which monitors the output for proper signal strength.

22 Claims, 4 Drawing Sheets

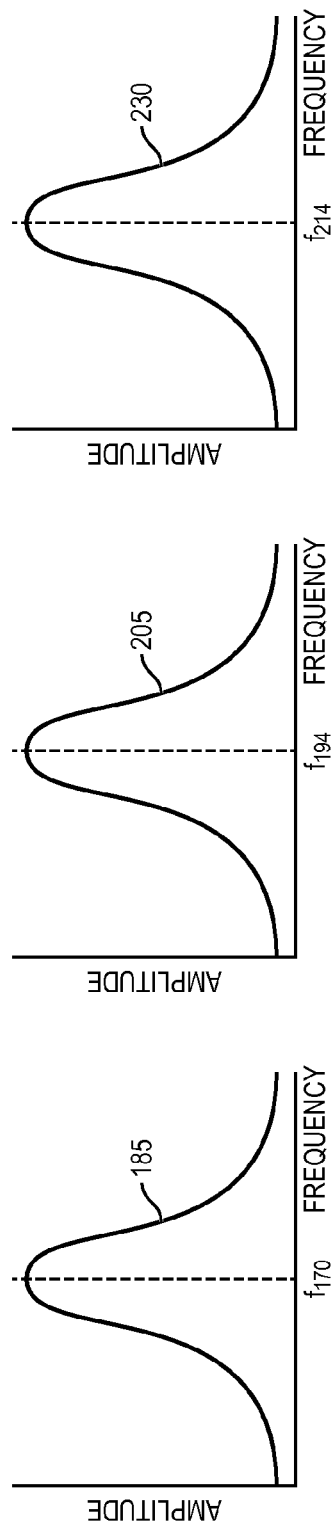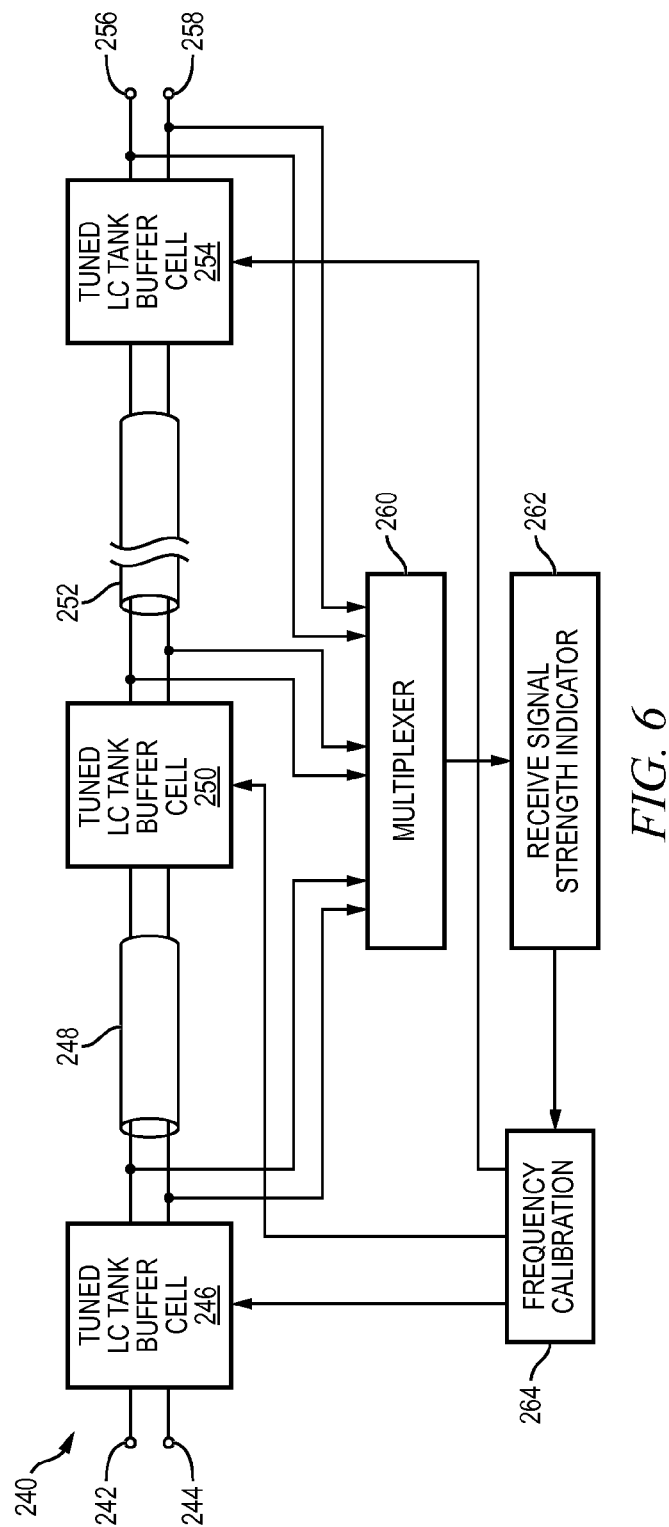

SEMICONDUCTOR DEVICE AND METHOD OF CASCADING MATCHED FREQUENCY WINDOW TUNED LC TANK BUFFERS

FIELD OF THE INVENTION

The present invention relates in general to semiconductor devices and, more particularly, to a semiconductor device and method of cascading multiple stages of matched frequency window tuned LC tank buffers for low power, low phase noise, single tone clock transmission over long distances.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, application specific integrated circuits (ASICs), and other specific functional circuits.

Semiconductor devices perform a wide range of functions such as signal processing, high-speed calculations, transmitting and receiving electromagnetic signals, controlling electronic devices, transforming sunlight to electricity, creating visual projections for television displays, and buffering transmission lines. Semiconductor devices are found in the fields of entertainment, communications, power conversion, mechanical control, networks, computers, and consumer products. Semiconductor devices are also found in military applications, aviation, automotive, industrial controllers, and office equipment.

In semiconductor devices, it is often necessary to transmit clock signals or data signals over a distance, e.g. micrometers (μm) to meters. To maintain the noise margin and integrity of the signal, a buffer is used to drive the signal along a transmission line. FIG. 1 shows a conventional current mode logic (CML) buffer circuit 10 receiving a differential clock signal or data signal at terminals 12 and 14. The CLK signal is applied to the gates of n-channel metal oxide semiconductor field effect transistors (nMOSFET) 16 and 18. The sources of transistors 16 and 18 are coupled to current source 20 referenced to a low operating potential (ground) at terminal 22. The drains of transistors 16 and 18 are coupled to resistors 24 and 26 as resistive loads. Resistors 24 and 26 are coupled to inductor 27, which is center tapped to a high operating potential, e.g., $V_{DD}$=+2 to +5 VDC, at terminal 28.

For a p-type substrate, a "high or higher voltage" generally refers to a positive voltage less than or equal to the maximum positive operating potential ($V_{DD}$) and greater than a "low or lower voltage", and the "low or lower voltage" generally refers to a positive voltage greater than or equal to the minimum operating potential (ground) and less than the "high or higher voltage." When the CLK signal at terminal 12 is high with respect to terminal 14, transistor 16 switches to a conductive state ($V_{GS16}$ greater than threshold $V_{TH}$ of the transistor) and pulls the voltage at node 30 to a low value. Transistor 18 is non-conductive ($V_{GS18}$ not greater than $V_{TH}$) and resistor 26 pulls the voltage at node 32 to a high value. When the CLK signal at terminal 14 is high with respect to terminal 12, transistor 18 switches to a conductive state ($V_{GS18}$ greater than $V_{TH}$) and pulls the voltage at node 32 to a low value. Transistor 16 is non-conductive ($V_{GS16}$ not greater than $V_{TH}$) and resistor 24 pulls the voltage at node 30 to a high value.

The combination of transistors 16 and 18 and current source 20 drives the voltages at nodes 30 and 32 along transmission line 34. Transmission line 34 can be shielded and grounded, ranging from μm to meters in length. A terminating end of transmission line 34 is coupled to the gates of nMOSFETs 36 and 38, respectively. A pair of 50 ohm pull-up resistors 40 and 42 are coupled between the terminating end of transmission line 34 and terminal 28 operating at $V_{DD}$. The sources of transistors 36 and 38 are coupled to current source 44 referenced to a low operating potential (ground) at terminal 22. The drains of transistors 36 and 38 are coupled to resistors 46 and 48 as resistive loads. Resistors 46 and 48 are coupled to inductor 49, which is center tapped to a high operating potential, e.g., $V_{DD}$=+2 to +5 VDC, at terminal 28.

When the signal from transmission line 34 at the gate of transistor 36 is high with respect to the signal from transmission line 34 at the gate of transistor 38, transistor 36 switches to a conductive state ($V_{GS36}$ greater than $V_{TH}$) and pulls the voltage at output terminal 50 to a low value. Transistor 38 is non-conductive ($V_{GS38}$ not greater than $V_{TH}$) and resistor 48 pulls the voltage at output terminal 52 to a high value. When the signal at the gate of transistor 38 is high with respect to the signal at the gate of transistor 36, transistor 38 switches to a conductive state ($V_{GS38}$ greater than $V_{TH}$) and pulls the voltage at output terminal 52 to a low value. Transistor 36 is non-conductive ($V_{GS36}$ not greater than $V_{TH}$) and resistor 46 pulls the voltage at output terminal 50 to a high value.

CML buffer circuit 10 is a broadband amplifier using resistive drain loads for long distances. When driving high-speed clocks along long transmission lines, there is a trade-off between the distances that can be driven at a particular clock-frequency versus power. CML buffer circuit 10 tends to consume significant power, which is a disadvantage in minimal power configurations, such as battery applications.

SUMMARY OF THE INVENTION

A need exists for a buffer exhibiting low power and low phase noise over long distances. Accordingly, in one embodiment, the present invention is a tunable buffer circuit comprising a first transistor including first and second conduction terminals and a control terminal coupled for receiving an input signal. A second transistor includes first and second conduction terminals and a control terminal coupled for receiving the input signal. An inductor is coupled between the first conduction terminal of the first transistor and the first conduction terminal of the second transistor. A tunable capacitor is coupled between the first conduction terminal of the first transistor and the first conduction terminal of the second transistor.

In another embodiment, the present invention is a tunable buffer circuit comprising a first tunable buffer cell including an input coupled for receiving an input signal. A first transmission line is coupled to an output of the first tunable buffer cell. A second tunable buffer cell includes an input coupled to the first transmission line. A center frequency and bandwidth of the second tunable buffer cell is matched to a center frequency and bandwidth of the first tunable buffer cell.

In another embodiment, the present invention is a tunable buffer circuit comprising a first tunable buffer cell including an input coupled for receiving an input signal. A second tunable buffer cell includes an input adapted for coupling to an output of the first tunable buffer cell. The second tunable buffer cell is matched to the first tunable buffer cell.

In another embodiment, the present invention is a method of making a semiconductor device comprising the steps of forming a first tunable buffer cell including an input coupled for receiving an input signal, and forming a second tunable buffer cell including an input adapted for coupling to an output of the first tunable buffer cell. A center frequency of the second tunable buffer cell is matched to a center frequency of the first tunable buffer cell.

BRIEF DESCRIPTION OF THE DRAWINGS

FIGS. 5a-5c illustrate frequency responses for the multi-stage cascaded MFW tuned LC tank buffer of FIG. 4;

FIG. 6 illustrates monitoring signal strength of each stage of the cascaded MFW tuned LC tank buffer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
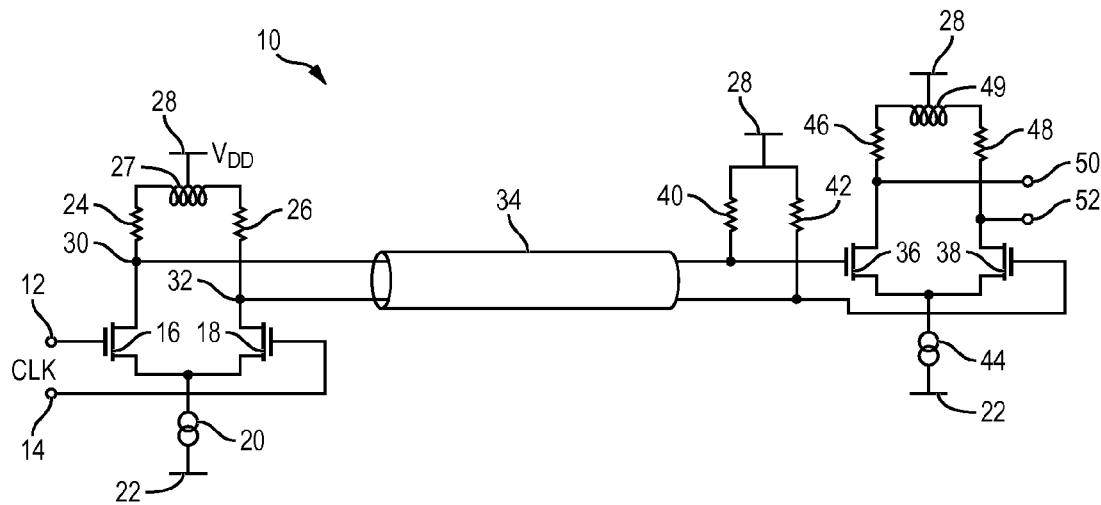
FIG. 1 illustrates a conventional CML buffer for a transmission line.
Figure 2:
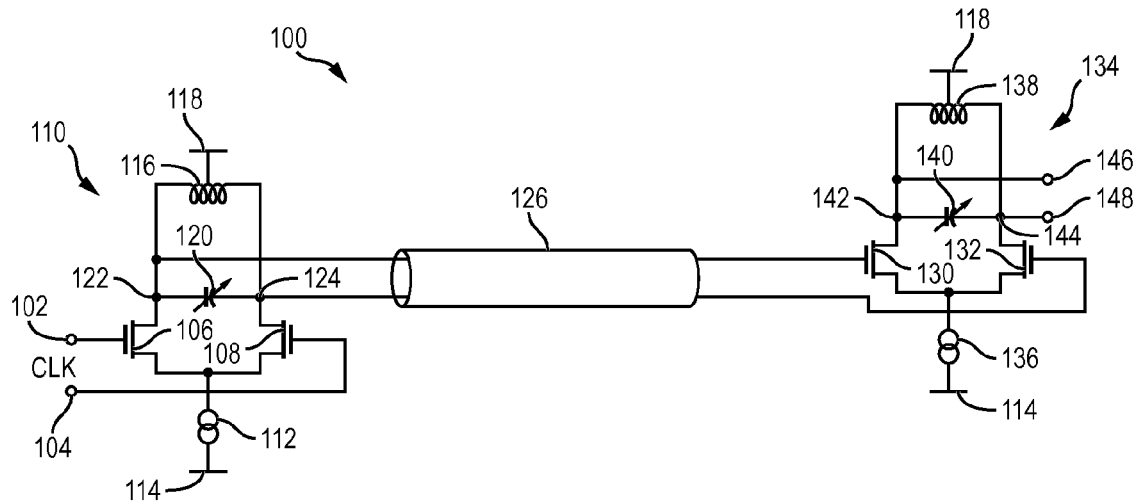
FIG. 2 illustrates a two-stage cascaded MFW tuned LC tank buffer.

FIG. 2 illustrates a two-stage cascaded matched frequency window (MFW) tuned inductor and capacitor (LC) tank buffer 100 that can be implemented in a substrate on a semiconductor die. The tuned LC tank buffer 100 receives a differential clock signal or data signal at terminals 102 and 104 and drives the clock signal or data signal along a transmission line over a distance, e.g., μm to meters, while maintaining high speed and low phase noise for low power applications. The cascaded MFW tuned LC tank buffer 100 is applicable to radio frequency (RF), very high frequency (VHF), ultra high frequency (UHF), monolithic microwave integrated circuit (MMIC), Ethernet, synchronous optical network (Sonet), fiber optic network, and data converters. In one embodiment, the signal is a single-tone sinusoidal 30-40 Gigahertz (GHz) clock signal. The CLK signal is applied to the gates of nMOSFETs 106 and 108 within tuned LC tank buffer cell 110. The sources of transistors 106 and 108 are coupled to current source 112 referenced to a low operating potential (ground) at terminal 114. The drains of transistors 106 and 108 are coupled to nodes 122 and 124 at opposite ends of inductor 116, which is center tapped to a high operating potential, e.g., $V_{DD}$=+1.2 to +5 VDC, at terminal 118. The inductor 116 provides inductive peaking to boost signal quality over long distances. A tunable or adjustable capacitor 120 is coupled between nodes 122 and 124 at the drains of transistors 106 and 108.

For a p-type substrate, a "high or higher voltage" generally refers to a positive voltage less than or equal to the maximum positive operating potential $V_{DD}$ and greater than a "low or lower voltage", and the "low or lower voltage" generally refers to a positive voltage greater than or equal to the minimum operating potential (ground) and less than the "high or higher voltage." When the CLK signal at terminal 102 is high with respect to terminal 104, transistor 106 switches to a conductive state ($V_{GS106}$ greater than $V_{TH}$) and pulls the voltage at node 122 to a low value. Transistor 108 is non-conductive ($V_{GS108}$ not greater than $V_{TH}$) and inductor 116 pulls the voltage at node 124 to a high value. When the CLK signal at terminal 104 is high with respect to terminal 102, transistor 108 switches to a conductive state ($V_{GS108}$ greater than $V_{TH}$) and pulls the voltage at node 124 to a low value. Transistor 106 is non-conductive ($V_{GS106}$ not greater than $V_{TH}$) and inductor 116 pulls the voltage at node 122 to a high value. The process repeats for each cycle of the CLK signal.

Figure 3A:
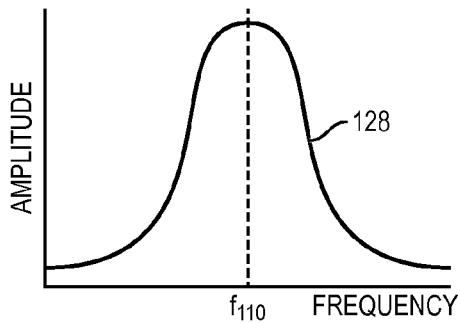
FIGS. 3a-3b illustrate frequency responses for the two-stage cascaded MFW tuned LC tank buffer of FIG. 2.

Tuned LC tank buffer cell 110 operates as a narrowband, resonating filter for the CLK signal with a frequency response 128, as shown in FIG. 3a. By proper selection of inductor 116, e.g., 200 picohenry (pH), and tuning or adjusting capacitor 120, e.g., 100±10 femtofarad (fF), tuned LC tank buffer cell 110 has a center frequency $f_{110}$ of 35.6 GHz and 3 dB bandwidth of 3-4 GHz. Alternatively, inductor 116 and/or capacitor 120 can be adjusted to achieve the desired center frequency and bandwidth. Any frequency component of the CLK signal outside the bandwidth of tuned LC tank buffer cell 110 is significantly attenuated. Accordingly, tuned LC tank buffer cell 110 processes a narrow frequency band of the CLK signal.

Tuned LC tank buffer cell 110 drives the narrow-band signals at nodes 122 and 124 along transmission line 126. Transmission line 126 can be shielded and grounded, ranging from μm to meters in length. In one embodiment, transmission line 126 is 200-300 μm or up to 1 millimeter (mm) in length. A terminating end of transmission line 126 is coupled to the gates of nMOSFETs 130 and 132 of tuned LC tank buffer cell 134. The sources of transistors 130 and 132 are coupled to current source 136 referenced to a low operating potential (ground) at terminal 114. The drains of transistors 130 and 132 are coupled to nodes 142 and 144 at opposite ends of inductor 138, which is center tapped to a high operating potential, e.g., $V_{DD}$=+1.2 to +5 VDC, at terminal 118. The inductor 138 provides inductive peaking to boost signal quality over long distances. A tunable or adjustable capacitor 140 is coupled between nodes 142 and 144 at the drains of transistors 130 and 132.

When the signal from transmission line 126 at the gate of transistor 130 is high with respect to the signal from transmission line 126 at the gate of transistor 132, transistor 130 switches to a conductive state ($V_{GS130}$ greater than $V_{TH}$) and pulls the voltage at node 142 and output terminal 146 to a low value. Transistor 132 is non-conductive ($V_{GS132}$ not greater than $V_{TH}$) and inductor 138 pulls the voltage at node 144 and output terminal 148 to a high value. When the signal from transmission line 126 at the gate of transistor 132 is high with respect to the signal from transmission line 126 at the gate of transistor 130, transistor 132 switches to a conductive state ($V_{GS132}$ greater than $V_{TH}$) and pulls the voltage at node 144 and output terminal 148 to a low value. Transistor 130 is non-conductive ($V_{GS130}$ not greater than $V_{TH}$) and inductor 138 pulls the voltage at node 142 and output terminal 146 to a high value. The process repeats for each cycle of the CLK signal.

Figure 3B:
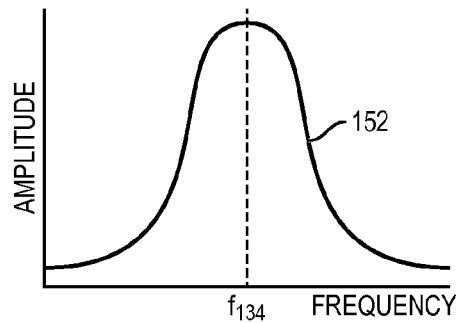

Tuned LC tank buffer cell 134 operates as a narrowband, resonating filter for the CLK signal with a frequency response 152, as shown in FIG. 3b. The center frequency $f_{134}$ and bandwidth of tuned LC tank buffer cell 134 is matched to the center frequency $f_{110}$ and bandwidth of tuned LC tank buffer cell 110. By proper selection of inductor 138, e.g., 200 pH, and tuning of capacitor 140, e.g., 100±10 fF, tuned LC tank buffer cell 134 has a center frequency $f_{134}$ of 35.6 GHz and 3 dB bandwidth of 3-4 GHz. Alternatively, inductor 138 and/or capacitor 140 can be adjusted to achieve the desired center frequency and bandwidth. Any frequency component of the CLK signal outside the bandwidth of tuned LC tank buffer cells 110 and 134 is significantly attenuated. Accordingly, tuned LC tank buffer cells 110 and 134 process a narrow frequency band of the CLK signal. Frequency response 152 of tuned LC tank buffer cell 134 is the same as frequency response 128 of tuned LC tank buffer cell 110, i.e., the curve in FIG. 3b is aligned with or contained in the same frequency match window as the curve in FIG. 3a. Given the MFW of tuned LC tank buffer cells 110 and 134, a narrow frequency band of the CLK signal is transmitted along transmission line 126 at high speed and available at output terminals 146 and 148 with low phase noise and low thermal noise for a high signal-to-noise ratio (SNR) and high signal quality at lower power by nature of frequency response 152 and frequency response 128 being tuned to fall within the same matched frequency window. In one embodiment, CLK signal exhibits an amplitude swing of 950 millivolts (mV), −172 phase noise dBc/Hz at 10 KHz, 9 figure of merit, and 16 milliamps (mA).

Figure 4:
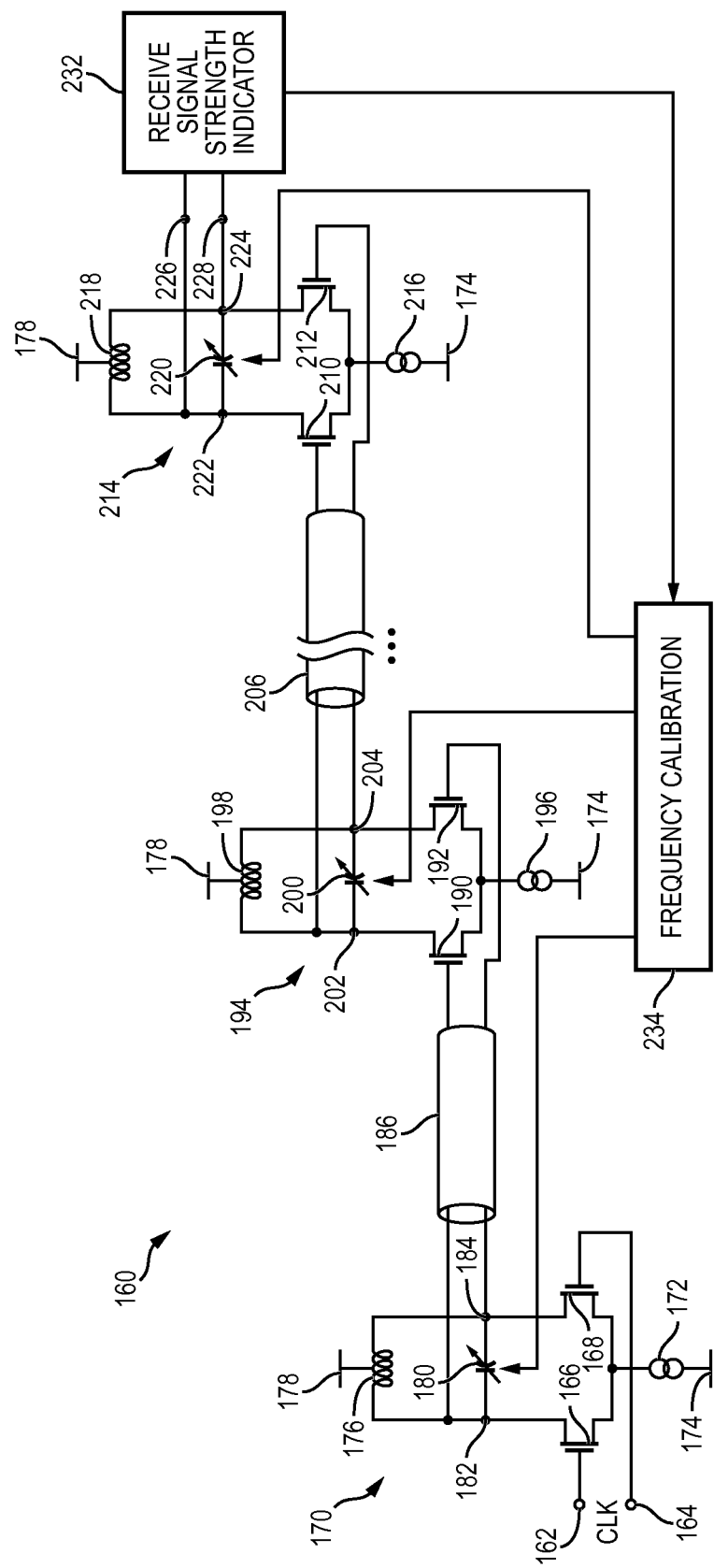
FIG. 4 illustrates a multi-stage cascaded MFW tuned LC tank buffer.

FIG. 4 illustrates a multi-stage cascaded MFW tuned LC tank buffer 160 that can be implemented in a substrate on a semiconductor die. The cascaded MFW tuned LC tank buffer 160 is shown with three stages, although a greater number of stages can be implemented for longer distance. The tuned LC tank buffer 160 receives a differential clock signal or data signal at terminals 162 and 164 and drives the clock signal or data signal along one or more transmission lines over a distance, e.g., μm to meters, while maintaining high speed and low phase noise for low power applications. The cascaded MFW tuned LC tank buffer 160 is applicable to RF, VHF, UHF, MMIC, Ethernet, Sonet, fiber optic network, and data converters. In one embodiment, the signal is a single-tone sinusoidal 30-40 GHz clock signal. The CLK signal is applied to the gates of nMOSFETs 166 and 168 within tuned LC tank buffer cell 170. The sources of transistors 166 and 168 are coupled to current source 172 referenced to a low operating potential (ground) at terminal 174. The drains of transistors 166 and 168 are coupled to nodes 182 and 184 at opposite ends of inductor 176, which is center tapped to a high operating potential, e.g., $V_{DD}$=+1.2 to +5 VDC, at terminal 178. The inductor 176 provides inductive peaking to boost signal quality over long distances. A tunable or adjustable capacitor 180 is coupled between nodes 182 and 184.

When the CLK signal at terminal 162 is high with respect to terminal 164, transistor 166 switches to a conductive state and pulls the voltage at node 182 to a low value. Transistor 168 is non-conductive and inductor 176 pulls the voltage at node 184 to a high value. When the CLK signal at terminal 164 is high with respect to terminal 162, transistor 168 switches to a conductive state and pulls the voltage at node 184 to a low value. Transistor 166 is non-conductive and inductor 176 pulls the voltage at node 182 to a high value. The process repeats for each cycle of the CLK signal.

Tuned LC tank buffer cell 170 operates as a narrowband, resonating filter for the CLK signal with a frequency response 185, as shown in FIG. 5a. By proper selection of inductor 176, e.g., 200 pH, and tuning or adjusting capacitor 180, e.g., 100±10 fF, tuned LC tank buffer cell 170 has a center frequency $f_{170}$ of 35.6 GHz and 3 dB bandwidth of 3-4 GHz. Alternatively, inductor 176 and/or capacitor 180 can be adjusted to achieve the desired center frequency and bandwidth. Any frequency component of the CLK signal outside the bandwidth of tuned LC tank buffer cell 170 is significantly attenuated. Accordingly, tuned LC tank buffer cell 170 processes a narrow frequency band of the CLK signal.

Tuned LC tank buffer cell 170 drives the narrow-band signals at nodes 182 and 184 along transmission line 186. Transmission line 186 can be shielded and grounded, ranging from μm to meters in length. In one embodiment, transmission line 186 is 200-300 μm or up to 1 mm in length. A terminating end of transmission line 186 is coupled to the gates of nMOSFETs 190 and 192 of tuned LC tank buffer cell 194. The sources of transistors 190 and 192 are coupled to current source 196 referenced to a low operating potential (ground) at terminal 174. The drains of transistors 190 and 192 are coupled to nodes 202 and 204 at opposite ends of inductor 198, which is center tapped to a high operating potential, e.g., $V_{DD}$=+1.2 to +5 VDC, at terminal 178. The inductor 198 provides inductive peaking to boost signal quality over long distances. A tunable or adjustable capacitor 200 is coupled between nodes 202 and 204.

When the signal from transmission line 186 at the gate of transistor 190 is high with respect to the signal from transmission line 186 at the gate of transistor 192, transistor 190 switches to a conductive state and pulls the voltage at node 202 to a low value. Transistor 192 is non-conductive and inductor 198 pulls the voltage at node 204 to a high value. When the signal from transmission line 186 at the gate of transistor 192 is high with respect to the signal from transmission line 186 at the gate of transistor 190, transistor 192 switches to a conductive state and pulls the voltage at node 204 to a low value. Transistor 190 is non-conductive and inductor 198 pulls the voltage at node 202 to a high value. The process repeats for each cycle of the CLK signal.

Tuned LC tank buffer cell 194 operates as a narrowband, resonating filter for the CLK signal with a frequency response 205, as shown in FIG. 5b. The center frequency $f_{194}$ and bandwidth of tuned LC tank buffer cell 194 is matched to the center frequency $f_{170}$ and bandwidth of tuned LC tank buffer cell 170. By proper selection of inductor 198, e.g., 200 pH, and tuning or adjusting capacitor 200, e.g., 100±110 fF, tuned LC tank buffer cell 194 has a center frequency $f_{194}$ of 35.6 GHz and 3 dB bandwidth of 3-4 GHz. Alternatively, inductor 198 and/or capacitor 200 can be adjusted to achieve the desired center frequency and bandwidth. Frequency response 205 of tuned LC tank buffer cell 194 is the same as frequency response 185 of tuned LC tank buffer cell 170, i.e., the curve in FIG. 5b is aligned with or contained in the same frequency match window as the curve in FIG. 5a. Any frequency component of the CLK signal outside the bandwidth of tuned LC tank buffer cells 170 and 194 is significantly attenuated. Accordingly, tuned LC tank buffer cell 194 processes a narrow frequency band of the CLK signal.

Tuned LC tank buffer cell 194 drives the narrow-band signals at nodes 202 and 204 along transmission line 206. Transmission line 206 can be shielded and grounded, ranging from μm to meters in length. In one embodiment, transmission line 206 is 200-300 μm or up to 1 mm in length. Any number of tuned LC tank buffer cells and transmission lines can be cascaded together. A terminating end of the last transmission line, e.g., transmission line 206, is coupled to the gates of nMOSFETs 210 and 212 of tuned LC tank buffer cell 214. The sources of transistors 210 and 212 are coupled to current source 216 referenced to a low operating potential (ground) at terminal 174. The drains of transistors 210 and 212 are coupled to nodes 222 and 224 at opposite ends of inductor 218, which is center tapped to a high operating potential, e.g., $V_{DD}$=+1.2 to +5 VDC, at terminal 178. The inductor 218 provides inductive peaking to boost signal quality over long distances. A tunable or adjustable capacitor 220 is coupled between nodes 222 and 224.

When the signal from transmission line 206 at the gate of transistor 210 is high with respect to the signal from transmission line 206 at the gate of transistor 212, transistor 210 switches to a conductive state and pulls the voltage at node 222 and output terminal 226 to a low value. Transistor 212 is non-conductive and inductor 218 pulls the voltage at node 224 and output terminal 228 to a high value. When the signal from transmission line 206 at the gate of transistor 212 is high with respect to the signal from transmission line 206 at the gate of transistor 210, transistor 212 switches to a conductive state and pulls the voltage at node 224 and output terminal 228 to a low value. Transistor 210 is non-conductive and inductor 218 pulls the voltage at node 222 and output terminal 226 to a high value. The process repeats for each cycle of the CLK signal.

Tuned LC tank buffer cell 214 operates as a narrowband, resonating filter for the CLK signal with a frequency response 230, as shown in FIG. 5c. The center frequency $f_{214}$ and bandwidth of tuned LC tank buffer cell 214 is matched to the center frequency $f_{170}$ and bandwidth of tuned LC tank buffer cell 170 and to the center frequency $f_{194}$ and bandwidth of tuned LC tank buffer cell 194. By proper selection of inductor 218, e.g., 200 pH, and tuning of capacitor 220, e.g., 100±10 fF, tuned LC tank buffer cell 214 has a center frequency $f_{214}$ of 35.6 GHz and 3 dB bandwidth of 3-4 GHz. Alternatively, inductor 218 and/or capacitor 220 can be adjusted to achieve the desired center frequency and bandwidth. Any frequency component of the CLK signal outside the bandwidth of tuned LC tank buffer cells 170, 194, and 214 is significantly attenuated. Accordingly, tuned LC tank buffer cells 170, 194, and 214 process a narrow frequency band of the CLK signal. Frequency response 230 of tuned LC tank buffer cell 214 is the same as frequency responses 185 and 205 of tuned LC tank buffer cells 170 and 194, i.e., the curve in FIG. 5c is aligned with or contained in the same frequency match window as the curves in FIGS. 5a and 5b. Given the MFW of tuned LC tank buffer cells 170, 194, and 214, a narrow frequency band of the CLK signal is transmitted along transmission lines 186 and 206 at high speed and available at output terminals 226 and 228 with low phase noise and low thermal noise for a high SNR and high signal quality at lower power by nature of frequency responses 185, 205, and 230 being tuned to fall within the same matched frequency window. In one embodiment, CLK signal exhibits an amplitude swing of 950 mV, −172 phase noise dBc/Hz at 10 KHz, 9 figure of merit, and 16 mA.

A receive signal strength indicator (RSSI) 232 monitors the signal strength at output terminals 226 and 228 and controls frequency calibration block 234 to digitally adjust tunable capacitors 180, 200, and 220. If the signal strength is less than a predetermined threshold, then frequency responses 185, 205, and 230 are not matched, i.e., one or more of the frequency responses is out of alignment causing loss of signal strength. RSSI 232 controls frequency calibration block 234 to adjust tunable capacitors 180, 200, and 220 as necessary to achieve maximum signal strength or at least a signal strength above the threshold. The value of each capacitor 180, 200, and 220 is set by a digital code or signal, e.g., 4, 8, or 16 bits. The value of the digital code sets the value of the capacitor over its tuning range. For example, frequency calibration block 234 sends a digital code to set capacitors 180, 200, and 220 to a mid-design value. Frequency calibration block 234 then incrementally adjusts or sweeps the values of capacitors 180, 200, and 220 by one bit increments above and below the mid-design value while RSSI 232 monitors the signal strength at output terminals 226 and 228. When the signal strength is maximum, or at least greater than a threshold, as determined by RSSI 232, then tuned LC tank buffer cells 170, 194, and 214 are aligned or contained in the same frequency match window.

FIG. 6 illustrates a multi-stage cascaded MFW tuned LC tank buffer 240 that can be implemented in a substrate on a semiconductor die. The cascaded MFW tuned LC tank buffer 240 is shown with three stages, although a greater number of stages can be implemented for longer distance. The tuned LC tank buffer 240 receives a differential clock signal or data signal at terminals 242 and 244 and drives the clock signal or data signal along a transmission line over a distance, e.g., μm to meters, while maintaining high speed and low phase noise for low power applications. The cascaded MFW tuned LC tank buffer 240 is applicable to RF, VHF, UHF, MMIC, Ethernet, Sonet, fiber optic network, and data converters. In one embodiment, the signal is a single-tone sinusoidal 30-40 GHz clock signal. Tuned LC tank buffer cell 246 is similar to tuned LC tank buffer cell 170 in FIG. 4. The CLK signal is applied to the gates of the nMOSFETs within tuned LC tank buffer cell 246. Tuned LC tank buffer cell 246 operates as a narrowband, resonating filter for the CLK signal with a frequency response, similar to FIG. 5a.

Tuned LC tank buffer cell 246 drives the narrow-band signals along transmission line 248. Transmission line 248 can be shielded and grounded, ranging from μm to meters in length. In one embodiment, transmission line 248 is 200-300 μm or up to 1 mm in length. Tuned LC tank buffer cell 250 is similar to tuned LC tank buffer cell 194 in FIG. 4. A terminating end of transmission line 248 is coupled to the gates of the nMOSFETs of LC tank buffer cell 250.

Tuned LC tank buffer cell 250 operates as a narrowband, resonating filter for the CLK signal with a frequency response, similar to FIG. 5b. The center frequency and bandwidth of tuned LC tank buffer cell 250 is matched to the center frequency and bandwidth of tuned LC tank buffer cell 246. Tuned LC tank buffer cell 250 drives the narrow-band signals along transmission line 252. Transmission line 252 can be shielded and grounded, ranging from μm to meters in length. In one embodiment, transmission line 252 is 200-300 μm or up to 1 mm in length. Any number of tuned LC tank buffer cells and transmission lines can be cascaded together. A terminating end of the last transmission line, e.g., transmission line 252, is coupled to the gates of the nMOSFETs of tuned LC tank buffer cell 254. Tuned LC tank buffer cell 254 operates as a narrowband, resonating filter for the CLK signal with a frequency response, similar to FIG. 5c. The center frequency and bandwidth of tuned LC tank buffer cell 254 is matched to the center frequency and bandwidth of tuned LC tank buffer cell 246 and to the center frequency and bandwidth of tuned LC tank buffer cell 250. Given the MFW of tuned LC tank buffer cells 246, 250, and 254, a narrow frequency band of the CLK signal is transmitted along transmission lines 248 and 252 at high speed and available at output terminals 256 and 258 with low phase noise and low thermal noise for a high SNR and high signal quality at lower power by nature of the frequency responses of LC tank buffer cells 246, 250, and 254 being tuned to fall within the same matched frequency window. In one embodiment, CLK signal exhibits an amplitude swing of 950 mV, −172 phase noise dBc/Hz at 10 KHz, 9 figure of merit, and 16 mA.

The outputs of tuned LC tank buffer cells 246, 250, and 254 are coupled through multiplexer 260 to RSSI 262 to monitor the signal strength for each tuned LC tank buffer cell. RSSI 262 controls frequency calibration block 264 to digitally adjust the tunable capacitors within tuned LC tank buffer cells 246, 250, and 254, as described for tunable capacitors 180, 200, and 220 in tuned LC tank buffer 160 of FIG. 4. If the signal strength is less than a predetermined threshold, then frequency responses of tuned LC tank buffer cells 246, 250, and 254 are not matched, i.e., one or more of the frequency responses is out of alignment causing loss of signal strength. RSSI 262 controls frequency calibration block 264 to adjust the tunable capacitors as necessary to achieve maximum signal strength or at least a signal strength above the threshold. The value of each capacitor is set by a digital code or signal, e.g., 4, 8, or 16 bits. The value of the digital code sets the value of the capacitor over its tuning range. For example, the signal strength at the output of tuned LC tank buffer cell 246 is routed through multiplexer 260 to RSSI 262. RSSI 262 controls frequency calibration block 264 to send a digital code to set tunable capacitor in tuned LC tank buffer cell 246 to a mid-design value. Multiplexer 260 switches to the output of tuned LC tank buffer cell 250. RSSI 262 monitors to the signal strength at the output of LC buffer cell 250 and controls frequency calibration block 264 to incrementally adjust the value of the tunable capacitor within tuned LC tank buffer cell 246 and/or tuned LC tank buffer cell 250 by one bit increments until the signal strength is maximum, or at least greater than a threshold, as determined by RSSI 262. Multiplexer 260 switches to the output of tuned LC tank buffer cell 254. RSSI 262 monitors to the signal strength at the output of LC buffer cell 254 and controls frequency calibration block 264 to incrementally adjust the value of the tunable capacitor within tuned LC tank buffer cell 246, tuned LC tank buffer cell 250, and/or tuned LC tank buffer cell 254 by one bit increments until the signal strength is maximum, or at least greater than a threshold, as determined by RSSI 262. Once the signal strength is maximum, or at least greater than a threshold, tuned LC tank buffer cells 246, 250, and 254 are aligned or contained in the same frequency match window.

Figure 7:
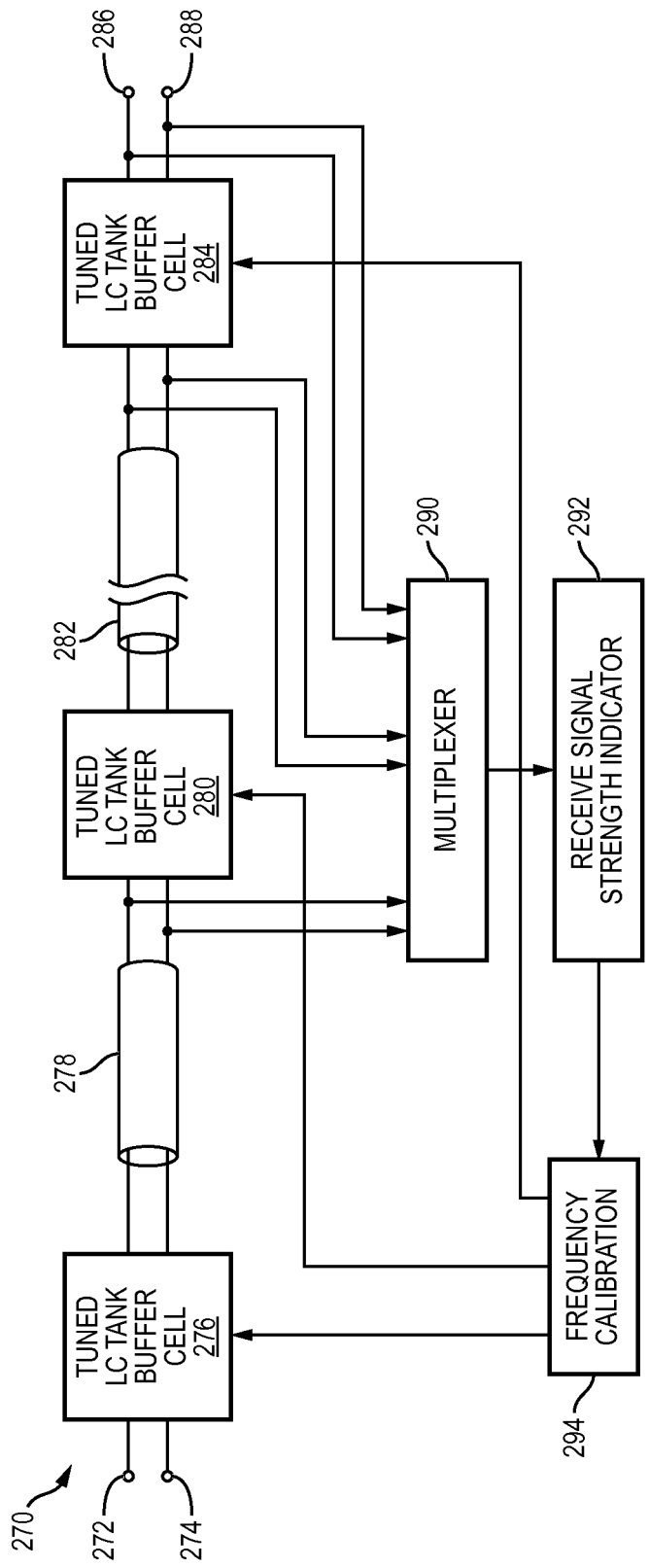
FIG. 7 illustrates another embodiment of monitoring signal strength of each stage of the cascaded MFW tuned LC tank buffer.

FIG. 7 illustrates a multi-stage cascaded MFW tuned LC tank buffer 270 that can be implemented in a substrate on a semiconductor die. The cascaded MFW tuned LC tank buffer 270 is shown with three stages, although a greater number of stages can be implemented for longer distance. The tuned LC tank buffer 270 receives a differential clock signal or data signal at terminals 272 and 274 and drives the clock signal or data signal along a transmission line over a distance, e.g., μm to meters, while maintaining high speed and low phase noise for low power applications. The cascaded MFW tuned LC tank buffer 270 is applicable to RF, VHF, UHF, MMIC, Ethernet, Sonet, fiber optic network, and data converters. In one embodiment, the signal is a single-tone sinusoidal 30-40 GHz clock signal. Tuned LC tank buffer cell 276 is similar to tuned LC tank buffer cell 170 in FIG. 4. The CLK signal is applied to the gates of the nMOSFETs within tuned LC tank buffer cell 276. Tuned LC tank buffer cell 276 operates as a narrowband, resonating filter for the CLK signal with a frequency response, similar to FIG. 5a.

Tuned LC tank buffer cell 276 drives the narrow-band signals along transmission line 278. Transmission line 278 can be shielded and grounded, ranging from μm to meters in length. In one embodiment, transmission line 278 is 200-300 μm or up to 1 mm in length. Tuned LC tank buffer cell 280 is similar to tuned LC tank buffer cell 194 in FIG. 4. A terminating end of transmission line 278 is coupled to the gates of the nMOSFETs of LC tank buffer cell 280.

Tuned LC tank buffer cell 280 operates as a narrowband, resonating filter for the CLK signal with a frequency response, similar to FIG. 5b. The center frequency and bandwidth of tuned LC tank buffer cell 280 is matched to the center frequency and bandwidth of tuned LC tank buffer cell 276. Tuned LC tank buffer cell 280 drives the narrow-band signals along transmission line 282. Transmission line 282 can be shielded and grounded, ranging from μm to meters in length. In one embodiment, transmission line 282 is 200-300 μm or up to 1 mm in length. Any number of tuned LC tank buffer cells and transmission lines can be cascaded together. A terminating end of the last transmission line, e.g., transmission line 282, is coupled to the gates of the nMOSFETs of tuned LC tank buffer cell 284. Tuned LC tank buffer cell 284 operates as a narrowband, resonating filter for the CLK signal with a frequency response, similar to FIG. 5c. The center frequency and bandwidth of tuned LC tank buffer cell 284 is matched to the center frequency and bandwidth of tuned LC tank buffer cell 276 and to the center frequency and bandwidth of tuned LC tank buffer cell 280. Given the MFW of tuned LC tank buffer cells 276, 280, and 284, a narrow frequency band of the CLK signal is transmitted along transmission lines 278 and 282 at high speed and available at output terminals 286 and 288 with low phase noise and low thermal noise for a high SNR and high signal quality at lower power by nature of the frequency responses of LC tank buffer cells 276, 280, and 284 being tuned to fall within the same matched frequency window. In one embodiment, CLK signal exhibits an amplitude swing of 950 mV, −172 phase noise dBc/Hz at 10 KHz, 9 figure of merit, and 16 mA.

The outputs of transmission lines 278 and 282 and LC tank buffer cell 284 are coupled through multiplexer 290 to RSSI 292 to monitor the signal strength for each tuned LC tank buffer cell. RSSI 292 controls frequency calibration block 294 to digitally adjust the tunable capacitors within tuned LC tank buffer cells 276, 280, and 284, as described for tunable capacitors 180, 200, and 220 in tuned LC tank buffer 160 of FIG. 4. If the signal strength is less than a predetermined threshold, then frequency responses of tuned LC tank buffer cells 276, 280, and 284 are not matched, i.e., one or more of the frequency responses is out of alignment causing loss of signal strength. RSSI 292 controls frequency calibration block 294 to adjust the tunable capacitors as necessary to achieve maximum signal strength or at least a signal strength above the threshold. The value of each capacitor is set by a digital code or signal, e.g., 4, 8, or 16 bits. The value of the digital code sets the value of the capacitor over its tuning range. For example, the signal strength at the output of transmission line 278 is routed through multiplexer 290 to RSSI 292. RSSI 292 controls frequency calibration block 294 to send a digital code to set tunable capacitor in tuned LC tank buffer cell 276 to a mid-design value. Multiplexer 290 switches to the output of transmission line 282. RSSI 292 monitors the signal strength at the output of transmission line 282 and controls frequency calibration block 294 to incrementally adjust the value of the tunable capacitor within tuned LC tank buffer cell 276 and/or tuned LC tank buffer cell 280 by one bit increments until the signal strength is maximum, or at least greater than a threshold, as determined by RSSI 292. Multiplexer 290 switches to the output of tuned LC tank buffer cell 284. RSSI 292 monitors the signal strength at the output of LC buffer cell 284 and controls frequency calibration block 294 to incrementally adjust the value of the tunable capacitor within tuned LC tank buffer cell 276, tuned LC tank buffer cell 280, and/or tuned LC tank buffer cell 284 by one bit increments until the signal strength is maximum, or at least greater than a threshold, as determined by RSSI 292. Once the signal strength is maximum, or at least greater than a threshold, tuned LC tank buffer cells 276, 280, and 284 are aligned or contained in the same frequency match window.

While one or more embodiments of the present invention have been illustrated in detail, the skilled artisan will appreciate that modifications and adaptations to those embodiments may be made without departing from the scope of the present invention as set forth in the following claims.

What is claimed:

1. A tunable buffer circuit, comprising:
   a first transistor including first and second conduction terminals and a control terminal coupled for receiving an input signal;
   a second transistor including first and second conduction terminals and a control terminal coupled for receiving the input signal;
   an inductor coupled between the first conduction terminal of the first transistor and the first conduction terminal of the second transistor; and
   a tunable capacitor coupled between the first conduction terminal of the first transistor and the first conduction terminal of the second transistor.

2. The tunable buffer circuit of claim 1, further including a current source coupled to the second conduction terminal of the first transistor and to the second conduction terminal of the second transistor.

3. The tunable buffer circuit of claim 1, further including a transmission line coupled to the first conduction terminal of the first transistor and to the first conduction terminal of the second transistor.

4. The tunable buffer circuit of claim 3, further including a receive signal strength indicator coupled to an output of the tunable buffer circuit or transmission line.

5. The tunable buffer circuit of claim 1, further including a digital signal for adjusting the tunable capacitor.

6. The tunable buffer circuit of claim 1, wherein the tunable buffer circuit operates with a center frequency and bandwidth.

7. A tunable buffer circuit, comprising:
   a first tunable buffer cell including an input coupled for receiving an input signal;
   a first transmission line coupled to an output of the first tunable buffer cell;
   a second tunable buffer cell including an input coupled to the first transmission line, wherein a center frequency and bandwidth of the second tunable buffer cell is matched to a center frequency and bandwidth of the first tunable buffer cell; and
   a receive signal strength indicator coupled to an output of the first tunable buffer cell or the second tunable buffer cell.

8. The tunable buffer circuit of claim 7, further including:
   a second transmission line coupled to an output of the second tunable buffer cell; and
   a third tunable buffer cell including an input coupled to the second transmission line, wherein a center frequency and bandwidth of the third tunable buffer cell is matched to the center frequency and bandwidth of the second tunable buffer cell and to the center frequency and bandwidth of the first tunable buffer cell.

9. The tunable buffer circuit of claim 7, wherein the first tunable buffer cell includes:
   a first transistor including first and second conduction terminals and a control terminal coupled for receiving the input signal;
   a second transistor including first and second conduction terminals and a control terminal coupled for receiving the input signal;
   an inductor coupled between the first conduction terminal of the first transistor and the first conduction terminal of the second transistor; and
   a capacitor coupled between the first conduction terminal of the first transistor and the first conduction terminal of the second transistor.

10. The tunable buffer circuit of claim 9, further including a current source coupled to the second conduction terminal of the first transistor and to the second conduction terminal of the second transistor.

11. The tunable buffer circuit of claim 9, further including a center tap of the inductor coupled to an operating potential.

12. The tunable buffer circuit of claim 7, further including a digital signal for adjusting the second tunable buffer cell.

13. A tunable buffer circuit, comprising:
   a first tunable buffer cell including an input coupled for receiving an input signal;
   a second tunable buffer cell including an input adapted for coupling to an output of the first tunable buffer cell, wherein the second tunable buffer cell is matched to the first tunable buffer cell; and
   a receive signal strength indicator coupled to an output of the first tunable buffer cell or the second tunable buffer cell.

14. The tunable buffer circuit of claim 13, further including a first transmission line coupled between the first tunable buffer cell and second tunable buffer cell.

15. The tunable buffer circuit of claim 14, further including:
   a second transmission line coupled to an output of the second tunable buffer cell; and
   a third tunable buffer cell including an input coupled to the second transmission line, wherein the third tunable buffer cell is matched to the second tunable buffer cell and to the first tunable buffer cell.

16. The tunable buffer circuit of claim 13, wherein the first tunable buffer cell includes:
   a first transistor including first and second conduction terminals and a control terminal coupled for receiving the input signal;
   a second transistor including first and second conduction terminals and a control terminal coupled for receiving the input signal;
   an inductor coupled between the first conduction terminal of the first transistor and the first conduction terminal of the second transistor; and
   a capacitor coupled between the first conduction terminal of the first transistor and the first conduction terminal of the second transistor.

17. The tunable buffer circuit of claim 16, further including a current source coupled to the second conduction terminal of the first transistor and to the second conduction terminal of the second transistor.

18. The tunable buffer circuit of claim 13, further including a digital signal for adjusting the second tunable buffer cell.

19. A method of making a semiconductor device, comprising:
   forming a first tunable buffer cell including an input coupled for receiving an input signal;
   forming a second tunable buffer cell including an input adapted for coupling to an output of the first tunable buffer cell, wherein a center frequency of the second tunable buffer cell is matched to a center frequency of the first tunable buffer cell; and
   providing a receive signal strength indicator coupled to an output of the first tunable buffer cell or the second tunable buffer cell.

20. The method of claim 19, further including providing a first transmission line coupled between the first tunable buffer cell and second tunable buffer cell.

21. The method of claim 19, wherein forming the first tunable buffer cell includes:
   providing a substrate;
   forming a first transistor in the substrate including first and second conduction terminals and a control terminal coupled for receiving the input signal;
   forming a second transistor in the substrate including first and second conduction terminals and a control terminal coupled for receiving the input signal;
   forming an inductor over the substrate coupled between the first conduction terminal of the first transistor and the first conduction terminal of the second transistor; and
   forming a capacitor over the substrate coupled between the first conduction terminal of the first transistor and the first conduction terminal of the second transistor.

22. The method of claim 19, further including adjusting the second tunable buffer cell using a digital signal.

* * * * *